(12) United States Patent
Kim et al.

(10) Patent No.: US 8,232,642 B2
(45) Date of Patent: Jul. 31, 2012

(54) PRINTED CIRCUIT BOARD

(75) Inventors: Seong Cheol Kim, Gyeonggi-do (KR); Chang Jun Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 99 days.

(21) Appl. No.: 12/835,043

(22) Filed: Jul. 13, 2010

(65) Prior Publication Data

US 2011/0108982 A1    May 12, 2011

(30) Foreign Application Priority Data

Nov. 9, 2009  (KR) .................. 10-2009-0107585

(51) Int. Cl.
*H01L 23/488*    (2006.01)
(52) U.S. Cl. ............... 257/737; 257/786; 257/E23.023
(58) Field of Classification Search ............ 257/737, 257/786, E23.023
See application file for complete search history.

(56) References Cited

U.S. PATENT DOCUMENTS

| 7,091,619 B2 * | 8/2006 | Aoyagi ................... 257/777 |
| 2009/0102049 A1 * | 4/2009 | Murata et al. ............ 257/737 |

FOREIGN PATENT DOCUMENTS

| JP | 2001-168239 A | 6/2001 |
| JP | 2003-197335 A | 7/2003 |
| JP | 2008-028011 A | 2/2008 |
| JP | 2008-283109 A | 11/2008 |

\* cited by examiner

*Primary Examiner* — Trung Q Dang
(74) *Attorney, Agent, or Firm* — Ladas & Parry LLP

(57) ABSTRACT

A printed circuit board includes a body part formed with connection pads on a first surface thereof; and a warpage compensating part formed over the first surface of the body part and having a height that increases from edges toward a center of the warpage compensating part so that an upper surface of the warpage compensating part facing away from the first surface of the body part is convex upward. The warpage compensating part comprises conductive layer patterns formed over the first surface of the body part to be electrically connected to the connection pads; and a solder resist formed over the first surface of the body part so as to expose the conductive layer patterns. The height of the solder resist gradually increases from both edges toward a center of the solder resist.

20 Claims, 7 Drawing Sheets

PRINTED CIRCUIT BOARD

CROSS-REFERENCE TO RELATED APPLICATIONS

The present application claims priority to Korean patent application number 10-2009-0107585 filed on Nov. 9, 2009, which is incorporated herein by reference in its entirety.

BACKGROUND OF THE INVENTION

The present invention relates to a printed circuit board, and more particularly, to a printed circuit board which can improve the mounting reliability of a warped semiconductor chip.

A typical wafer is provided with hundreds to several thousands of semiconductor chips on which the same electrical circuits are printed. Electrical connections are formed so that the semiconductor chips can transmit and receive signals to and from an external means. Also, the semiconductor chips are sealed with an encapsulating mold so that the chips can withstand external shocks. A semiconductor chip with electrical connections and an encapsulating mold may be referred to as a semiconductor package, and such semiconductor packages can be manufactured to perform specified functions and to have a predetermined physical shape.

Even as electronic/electric products have become more highly functionalized, the volume of electronic terminals have been decreased, and the weights thereof have been reduced. Therefore, in order to meet the requirements toward light weight, slimness, compactness and miniaturization, the thin formation and high density mounting of a semiconductor package have been regarded as important factors.

Currently, in computers, notebooks, mobile phones, etc., while the capacity of a chip such as RAM (random access memory) and flash memory has been increased to satisfy memory capacity requirements, the trend toward miniaturization of a package has become prominent. Thus, the demand for a thin, light and compact semiconductor package which would accommodate this trend has abruptly increased.

In order to manufacture a thin semiconductor package, it is necessary to reduce the thickness of the semiconductor chip contained therein. However, limitations necessarily exist in reducing the thickness of a semiconductor chip. One main problem is caused during singulation when, after the back surface of a wafer is back-grinded, the semiconductor chips becomes warped in the course of manufacturing individual semiconductor chips by sawing the wafer and bonding semiconductor chips to a printed circuit board. Due to warpage, the mounting reliability of the semiconductor chips is degraded, and the manufacturing yield is decreased.

FIG. 1 is a view explaining such a problem.

Referring to FIG. 1, in the course of mounting a semiconductor chip 20 onto a printed circuit board 10, due to the curved shape of the warped semiconductor chip 20, bumps 21 located at the center portion A of the semiconductor chip are raised resulting in poor junctions. Further, at the edge portion B of the semiconductor chip 20, bumps 21 are overly compressed whereby signal lines are more apt to be short-circuited when the pitch is narrow. As a result, the mounting reliability of a semiconductor chip is degraded and the manufacturing yield is decreased.

BRIEF SUMMARY OF THE INVENTION

Embodiments of the present invention include a printed circuit board which can improve the mounting reliability of a warped semiconductor chip.

In one embodiment of the present invention, a printed circuit board comprises a body part formed with connection pads on a first surface thereof; and a warpage compensating part formed over the first surface of the body part and having a height that gradually increases from edges toward a center of the warpage compensating part so that an upper surface of the warpage compensating part facing away from the first surface of the body part is convex upward, the warpage compensating part comprising conductive layer patterns formed over the first surface of the body part to be electrically connected to the connection pads; and a solder resist formed over the first surface of the body part to expose the conductive layer patterns.

The conductive layer patterns may be formed on the connection pads.

The conductive layer patterns may be formed to have heights that gradually increase from both edges toward a center of the body part.

The conductive layer patterns may include at least any one of copper, nickel, gold and solder.

The conductive layer patterns may comprise conductive balls.

The warpage compensating part may further comprise insulation layer patterns which are formed under the conductive layer patterns an are covered by the conductive layer patterns.

The insulation layer patterns may be formed to have heights that are proportional to the heights of the conductive layer patterns which cover the insulation layer patterns.

The insulation layer patterns may have a hemispherical shape.

The warpage compensating part may further comprise conductive connection members which are electrically connected to the connection pads by passing through the solder resist, and the conductive layer patterns may be formed over the solder resist in such a way as to be electrically connected to the respective connection pads by the medium of the conductive connection members.

In another embodiment of the present invention, a printed circuit board comprises a body part formed with connection pads on a first surface thereof; and a warpage compensating part formed over the first surface of the body part and having a height that gradually decreases from edges toward a center of the warpage compensating part so that an upper surface of the warpage compensating part facing away from the first surface of the body part is concave downward, the warpage compensating part comprising conductive layer patterns formed over the first surface of the body part to be electrically connected to the connection pads; and a solder resist formed over the first surface of the body part to expose the conductive layer patterns.

The conductive layer patterns may be formed on the connection pads.

The conductive layer patterns may be formed to have heights that gradually decrease from both edges toward a center of the body part.

The conductive layer patterns may include at least any one of copper, nickel, gold and solder.

The conductive layer patterns may comprise conductive balls.

The warpage compensating part may further comprise insulation layer patterns which are formed under the conductive layer patterns to be covered by the conductive layer patterns.

The insulation layer patterns may be formed to have heights that are proportional to the heights of the conductive layer patterns which cover the insulation layer patterns.

The insulation layer patterns may have a hemispherical shape.

The warpage compensating part may further comprise conductive connection members which are electrically connected to the connection pads by passing through the solder resist, and the conductive layer patterns may be formed over the solder resist in such a way as to be electrically connected to the respective connection pads by the medium of the conductive connection members.

In another embodiment of the present invention, a semiconductor chip comprises a printed circuit board including a body part formed with connection pads on a first surface thereof and a warpage compensating part formed over the first surface of the body part and having a height that gradually increases from edges toward a center of the warpage compensating part so that an upper surface of the warpage compensating part facing away from the first surface of the body part is convex upward, and a semiconductor chip mounted to the printed circuit board and warped to be convex upward.

In another embodiment of the present invention, a semiconductor chip comprises a printed circuit board including a body part formed with connection pads on a first surface thereof and a warpage compensating part formed over the first surface of the body part and having a height that gradually decreases from edges toward a center of the warpage compensating part so that an upper surface of the warpage compensating part facing away from the first surface of the body part is concave downward, and a semiconductor chip mounted to the printed circuit board and warped to be concave downward.

DESCRIPTION OF SPECIFIC EMBODIMENTS

Hereafter, specific embodiments of the present invention will be described in detail with reference to the accompanying drawings.

It is to be understood herein that the drawings are not necessarily to scale and in some instances proportions may have been exaggerated in order to more clearly depict certain features of the invention.

Figure 1:
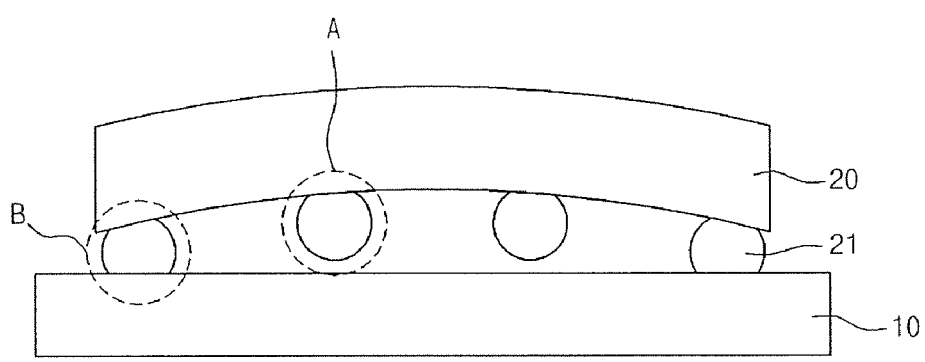
FIG. 1 is a view for explaining a problem caused by a warped semiconductor chip.
Figure 2:
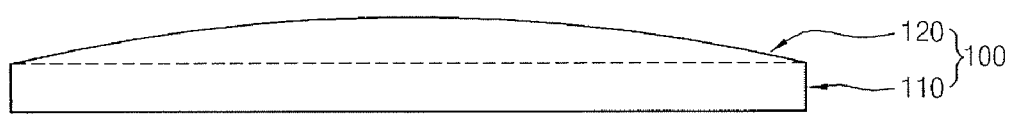
FIG. 2 is a cross-sectional view schematically showing a printed circuit board in accordance with an embodiment of the present invention.

FIG. 2 is a cross-sectional view schematically showing a printed circuit board in accordance with an embodiment of the present invention.

Referring to FIG. 2, a printed circuit board 100 in accordance with an embodiment of the present invention has a configuration in which the upper surface of the printed circuit board 100 is convex upward.

In detail, the printed circuit board 100 in accordance with an embodiment of the present invention includes a body part 110 and a warpage compensating part 120.

In an embodiment, the body part 110 can have a plate-like shape. The body part 110 having the plate-like shape has a first surface and a second surface which faces away from the first surface.

The warpage compensating part 120 is formed over the first surface of the body part 110. The warpage compensating part 120 has a lower surface which faces the first surface of the body part 110 and an upper surface which faces away from the first surface of the body part 110. The warpage compensating part 120 is formed to have a height that gradually increases from the edges toward the center of the warpage compensating part 120 such that the upper surface of the warpage compensating part 120 is convex upward.

A detailed configuration of the printed circuit board 100 in accordance with an embodiment of the present invention will be described with reference to FIGS. 3A through 3D.

FIGS. 3A through 3D are cross-sectional views showing various structures of the printed circuit board in accordance with embodiments of the present invention.

Figure 3A:
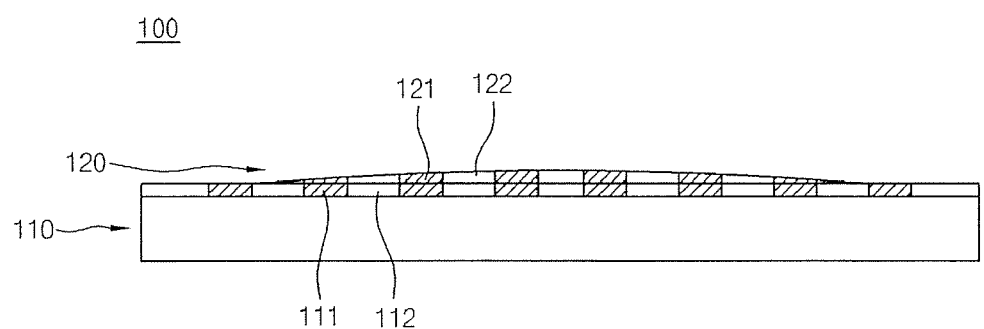
FIGS. 3A through 3D are cross-sectional views showing various structures of the printed circuit board in accordance with embodiments of the present invention.

Referring to FIG. 3A, a printed circuit board 100 having a first structure includes a body part 110 and a warpage compensating part 120.

The body part 110 can have, for example, a plate-like shape. The body part 110 having the plate-like shape has a first surface and a second surface which faces away from the first surface. The body part 110 includes, on the first surface thereof, a plurality of connection pads 111 and a protective layer 112 which is formed in such a way as to expose the connection pads 111.

The warpage compensating part 120 is formed over the first surface of the body part 110. The warpage compensating part 120 includes conductive layer patterns 121 which are formed on the connection pads 111 and a solder resist 122 which is formed over the first surface of the body part 110 in such a way as to expose the conductive layer patterns 121.

The heights of the respective conductive layer patterns gradually increase when moving from the edges to the center of the first surface 101 of the body part 110. That is, the height of a conductive layer pattern at the center of the warpage compensation part 121 is greater than the height of a conductive layer pattern at an edge of the warpage compensation part 121. Collectively, the conductive layer patterns 121 and the solder resist 122 have a height that gradually increases from the edges toward the center of the first surface of the body part 110. The conductive layer patterns 121 can include, for example, at least any one of copper (Cu), nickel (Ni), gold (Ag) and solder.

Figure 3B:
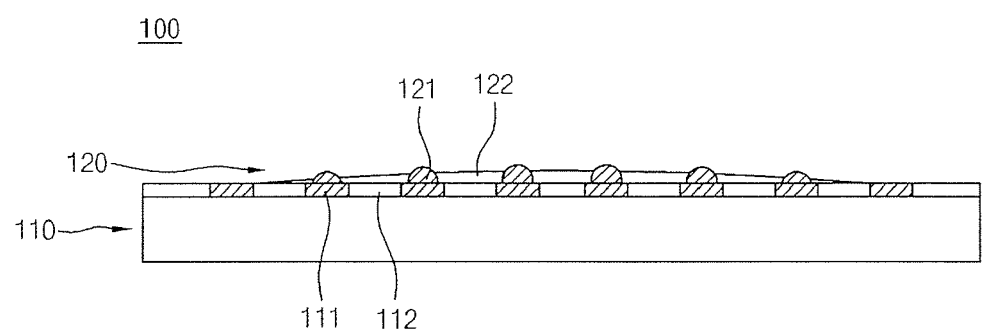

Referring to FIG. 3B, differently from the printed circuit board 100 having the first structure, in a printed circuit board 100 having a second structure, conductive layer patterns 121 include conductive balls.

The printed circuit board 100 having the second structure includes a body part 110 and a warpage compensating part 120.

The body part 110 can have, for example, a plate-like shape. The body part 110 has a first surface and a second surface which faces away from the first surface. The body part 110 includes, on the first surface thereof, a plurality of connection pads 111 and a protective layer 112 which is formed in such a way as to expose the connection pads 111.

The warpage compensating part 120 is formed over the first surface of the body part 110. The warpage compensating part 120 includes conductive layer patterns 121 which are formed on the connection pads 111 and include conductive balls, and a solder resist 122 which is formed over the first surface of the body part 110 in such a way as to expose the conductive layer patterns 121.

The solder resist 122 is formed to have a height that gradually increases from the edges toward the center of the first surface of the body part 110.

As the conductive balls constituting the conductive layer patterns 121, solder balls can be used. The sizes of the respective conductive balls constituting the conductive layer patterns 121 gradually increase from the edges toward the center of the first surface of the body part 110.

Figure 3C:
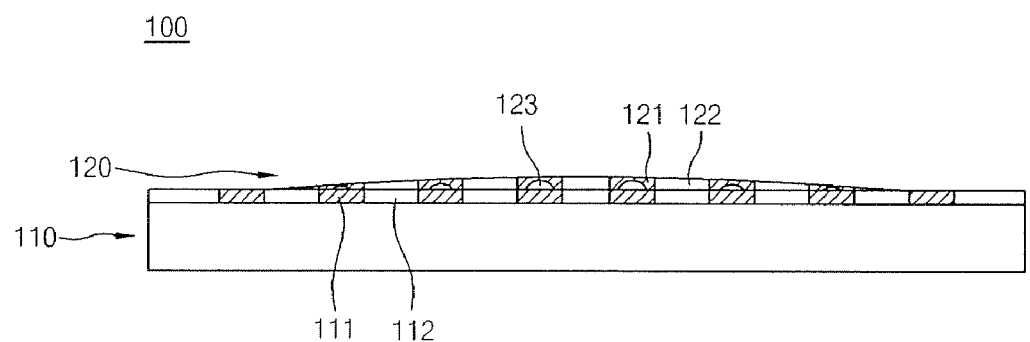

Referring to FIG. 3C, differently from the printed circuit board 100 having the first structure, a printed circuit board 100 having a third structure further includes insulation layer patterns 123 under conductive layer patterns 121.

The printed circuit board 100 having the third structure includes a body part 110 and a warpage compensating part 120.

The body part 110 can have, for example, a plate-like shape. The body part 110 has a first surface 101 and a second surface which faces away from the first surface. The body part 110 includes, on the first surface thereof, a plurality of connection pads 111 and a protective layer 112 which is formed in such a way as to expose the connection pads 111.

The warpage compensating part 120 is formed over the first surface of the body part 110. The warpage compensating part 120 includes insulation layer patterns 123 which are formed on portions of the connection pads 111, the conductive layer patterns 121 which are formed over the connection pads 111 in such a way as to cover the insulation layer patterns 123 and to be electrically connected to the respective connection pads 111, and a solder resist 122 which is formed over the first surface of the body part 110 in such a way as to expose the conductive layer patterns 121.

The solder resist 122 is formed to have a height that gradually increases from the edges toward the center of the first surface of the body part 110.

The insulation layer patterns 123 can have, for example, a substantially hemispherical shape. In one alternative embodiment, the insulation layer patterns 123 can have a rectangular hexahedral shape. The insulation layer patterns 123 can include, for example, a polymer.

The heights of the respective conductive layer patterns 121 gradually increase from the edges toward the center of the first surface of the body part 110. The conductive layer patterns 121 can include, for example, at least any one of copper, nickel, gold and solder.

The heights of the respective insulation layer patterns 123 can be formed to gradually increase from the edges toward the center of the first surface of the body part 110 in proportion to the heights of the respective conductive layer patterns 121.

When the insulation layer patterns 123 are formed under the conductive layer patterns 121 as described above, difference in thickness among the conductive layer patterns 121, which have different heights, can be reduced, whereby advantages can be provided in that a process for forming the conductive layer patterns 121 (for example, a plating process) can be more easily conducted.

Figure 3D:
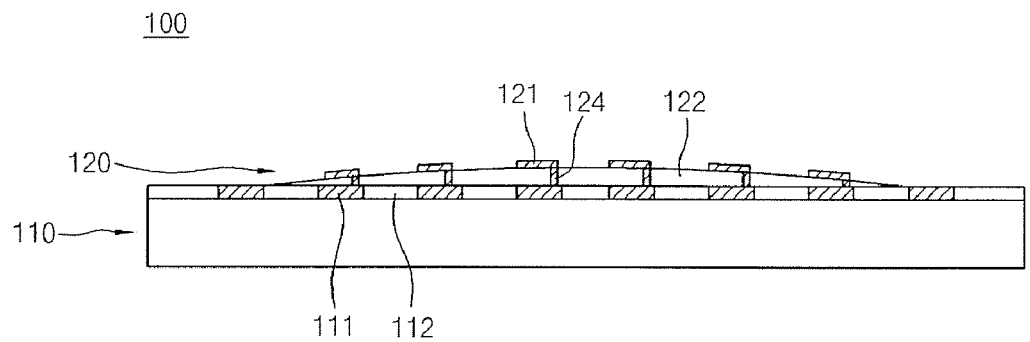

Referring to FIG. 3D, differently from the printed circuit board 100 having the first structure, a printed circuit board 100 having a fourth structure has a structure in which conductive layer patterns 121 and connection pads 111 are separated from each other with a solder resist 122 interposed therebetween. In the fourth structure shown in FIG. 3D, the conductive layer patterns 121 and connection pads 111 are electrically connected to each other by conductive connection members 124 formed through the solder resist 122.

The printed circuit board 100 having the fourth structure includes a body part 110 and a warpage compensating part 120.

The body part 110 can have, for example, a plate-like shape. The body part 110 has a first surface 101 and a second surface which faces away from the first surface. The body part 110 includes, on the first surface thereof, a plurality of connection pads 111 and a protective layer 112 which is formed in such a way as to expose the connection pads 111.

The warpage compensating part 120 is formed over the first surface of the body part 110. The warpage compensating part 120 includes the plurality of conductive patterns 121, the solder resist 122, and the conductive connection members 124.

The solder resist 122 is formed to have a height that gradually increases from the edges toward the center of the first surface of the body part 110.

The conductive layer patterns 121 are formed over the solder resist 122. The plurality of conductive layer patterns 121 can have the same thickness. The conductive layer patterns 121 can include, for example, at least any one of copper, nickel, gold and solder.

The conductive connection members 124 electrically connect the conductive layer patterns 121 to the connection pads 111 through the solder resist 122.

Figure 4:
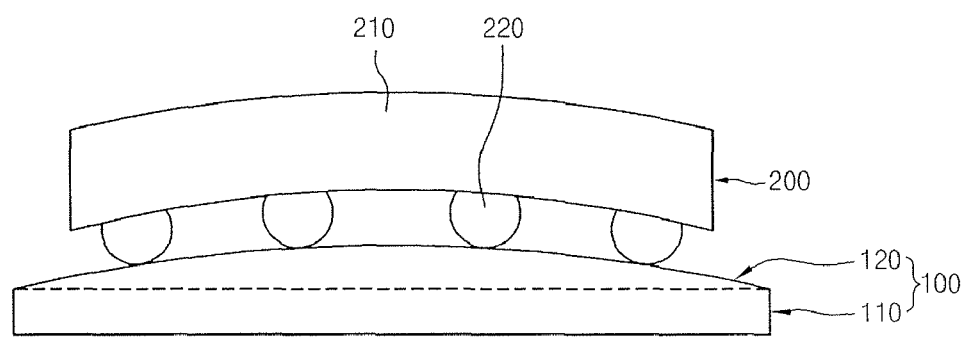
FIG. 4 is a cross-sectional view showing a semiconductor package using the printed circuit board in accordance with an embodiment of the present invention.

FIG. 4 is a cross-sectional view illustrating a semiconductor package using the printed circuit board in accordance with the embodiment of the present invention.

Referring to FIG. 4, a semiconductor package has a structure in which a semiconductor chip 200, which is warped so as to have a convex upward shape, is mounted to the printed circuit board 100 in accordance with the embodiment of the present invention, in a flip chip bonding type.

The printed circuit board 100 includes a body part 110 and a warpage compensating part 120 which is formed over the body part 110. The warpage compensating part 120 has a height that gradually increases from the edges toward the center of the warpage compensating part 120 such that the upper surface of the warpage compensating part 120 is convex upward.

The semiconductor chip 200 is mounted to the upper surface of the warpage compensating part 120 of the printed circuit board 100 in the flip chip bonding type.

The semiconductor chip 200 includes a chip body 210 and a plurality of bumps 220.

The chip body 210 can have, for example, a plate-like shape. While not shown in a drawing, bump pads are formed on the lower surface of the chip body 210. The bumps 220 are attached to the bump pads which are formed on the lower surface of the chip body 210.

The chip body 210 has a certain degree of warpage such that the chip body 210 is convex upward. Accordingly, even when warpage occurs in the semiconductor chip 200 in this way, the convex upward configuration of the warpage compensating part 120 of the printed circuit board 100 makes it possible to substantially prevent poor junctions from being formed or adjoining signal lines from being short-circuited due to the collapse of the bumps 220 of the semiconductor chip 200.

Figure 5:
FIG. 5 is a cross-sectional view schematically showing a printed circuit board in accordance with another embodiment of the present invention.

FIG. 5 is a cross-sectional view schematically showing a printed circuit board in accordance with another embodiment of the present invention.

Referring to FIG. 5, a printed circuit board 300 in accordance with an embodiment of the present invention has a height that gradually decreases from the edges toward the center of the printed circuit board 300 such that the upper surface of the printed circuit board 300 is concave downward.

The printed circuit board 300 in accordance with an embodiment of the present invention includes a body part 310 and a warpage compensating part 320.

The body part 310 can have, for example, a plate-like shape. The body part 310 has a first surface and a second surface which faces away from the first surface.

The warpage compensating part 320 is formed over the first surface of the body part 310. The warpage compensating part 320 has a lower surface which faces the first surface of the body part 310 and an upper surface which faces away from the first surface of the body part 310.

The warpage compensating part 320 is formed to have a height that gradually decreases from the edges toward the center of the warpage compensating part 320 such that the upper surface of the warpage compensating part 320 is concave downward.

The detailed configuration of the printed circuit board 300 in accordance with embodiments of the present invention will be described with reference to FIGS. 6A through 6D.

FIGS. 6A through 6D are cross-sectional views illustrating various structures of the printed circuit board in accordance with embodiments of the present invention.

Figure 6A:
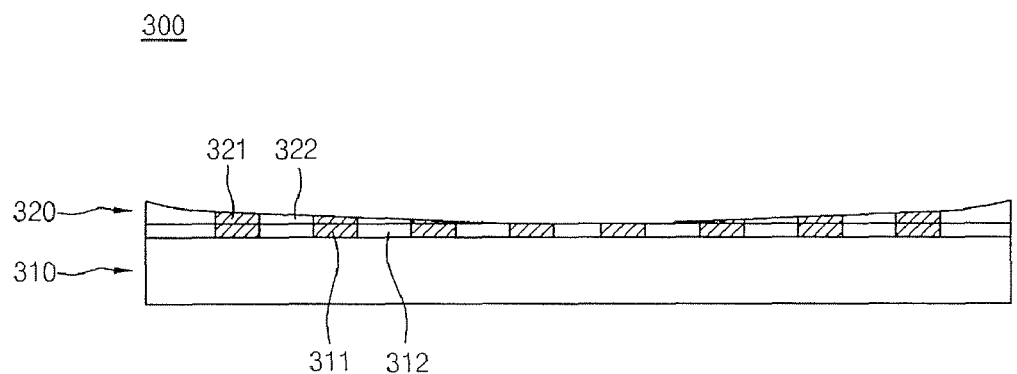
FIGS. 6A through 6D are cross-sectional views showing various structures of the printed circuit board in accordance with embodiments of the present invention.

Referring to FIG. 6A, a printed circuit board 300 having a fifth structure includes a body part 310 and a warpage compensating part 320.

The body part 310 can have, for example a plate-like shape. The body part 310 has a first surface 301 and a second surface which faces away from the first surface 301. The body part 310 includes, on the first surface 301 thereof, a plurality of connection pads 311 and a protective layer 312 which is formed in such a way as to expose the connection pads 311.

The warpage compensating part 320 is formed over the first surface 301 of the body part 310. The warpage compensating part 320 includes conductive layer patterns 321 which are formed on the connection pads 311 and a solder resist 322 which is formed over the first surface 301 of the body part 310 in such a way as to expose the conductive layer patterns 321.

The conductive layer patterns 321 and the solder resist 322 are formed to have heights that gradually decrease from the edges toward the center of the first surface of the body part 310. The conductive layer patterns 321 can include, for example, at least any one of copper, nickel, gold and solder.

Figure 6B:
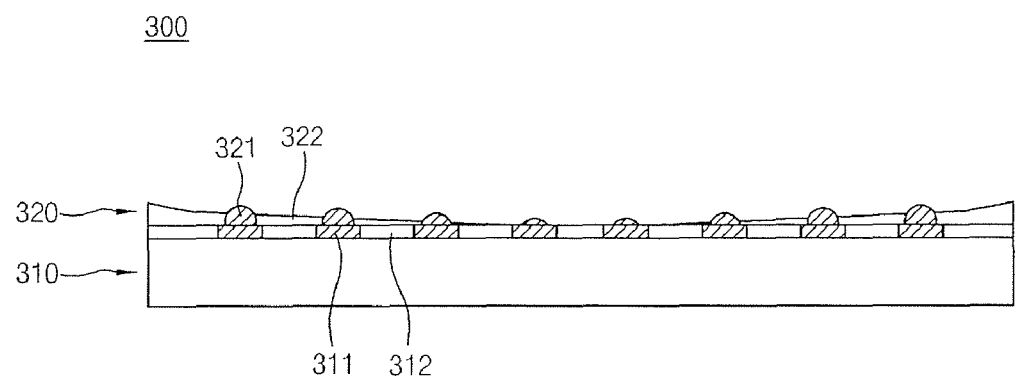

Referring to FIG. 6B, differently from the printed circuit board 300 having the fifth structure, in a printed circuit board 300 having a sixth structure, conductive layer patterns 321 include conductive balls.

The printed circuit board 300 having the sixth structure includes a body part 310 and a warpage compensating part 320.

The body part 310 can have a plate-like shape. The body part 310 having the plate-like shape has a first surface 301 and a second surface 302 which faces away from the first surface 301. The body part 310 includes, on the first surface thereof, a plurality of connection pads 311 and a protective layer 312 which is formed in such a way as to expose the connection pads 311.

The warpage compensating part 320 is formed over the first surface of the body part 310. The warpage compensating part 320 includes conductive layer patterns 321 which are formed on the connection pads 311 and include conductive balls, and a solder resist 322 which is formed over the first surface of the body part 310 in such a way as to expose the conductive layer patterns 321.

The solder resist 322 is formed to have a height that gradually decreases from the edges toward the center of the first surface of the body part 310.

As the conductive balls constituting the conductive layer patterns 321, solder balls can be used. The sizes of the respective conductive balls constituting the conductive layer patterns 321 gradually decrease from the edges toward the center of the first surface of the body part 310.

Figure 6C:
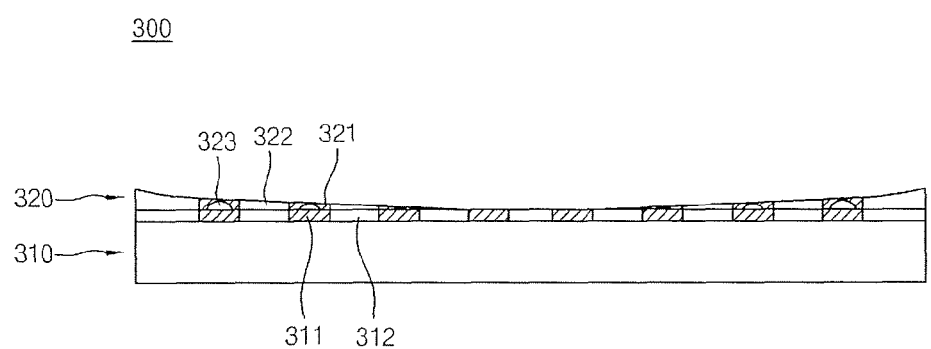

Referring to FIG. 6C, differently from the printed circuit board 300 having the fifth structure, a printed circuit board 300 having a seventh structure further includes insulation layer patterns 323 under conductive layer patterns 321.

The printed circuit board 300 having the seventh structure includes a body part 310 and a warpage compensating part 320.

The body part 310 can have a plate-like shape. The body part 310 having the plate-like shape has a first surface and a second surface which faces away from the first surface.

The body part 310 includes, on the first surface thereof, a plurality of connection pads 311 and a protective layer 312 which is formed in such a way as to expose the connection pads 311.

The warpage compensating part 320 is formed over the first surface of the body part 310.

The warpage compensating part 320 includes the insulation layer patterns 323 which are formed on portions of the connection pads 311, the conductive layer patterns 321 which are formed over the connection pads 311 in such a way as to cover the insulation layer patterns 323 and be electrically connected to the respective connection pads 311, and a solder resist 322 which is formed over the first surface of the body part 310 in such a way as to expose the conductive layer patterns 321.

The solder resist 322 is formed to have a height that gradually decreases from the edges toward the center of the first surface of the body part 310.

The insulation layer patterns 323 can have, for example, a substantially hemispherical shape. In one alternative embodiment, the insulation layer patterns 323 can have a rectangular hexahedral shape. The insulation layer patterns 323 can include, for example, polymer.

The conductive layer patterns 321 are formed over the connection pads 311 to surround the insulation layer patterns 323. The heights of the respective conductive layer patterns 321 gradually decrease from the edges toward the center of the first surface of the body part 310. The conductive layer patterns 321 can include, for example at least any one of copper, nickel, gold and solder.

The heights of the respective insulation layer patterns 323 can gradually decrease from the edges toward the center of the first surface of the body part 310 in proportion to the heights of the conductive layer patterns 321.

When the insulation layer patterns 323 are formed under the conductive layer patterns 321 as described above, difference in thickness among the conductive layer patterns 321, which have different heights, can be reduced, whereby advantages can be provided in that a process for forming the conductive layer patterns 321 (for example, a plating process) can be more easily conducted.

Figure 6D:
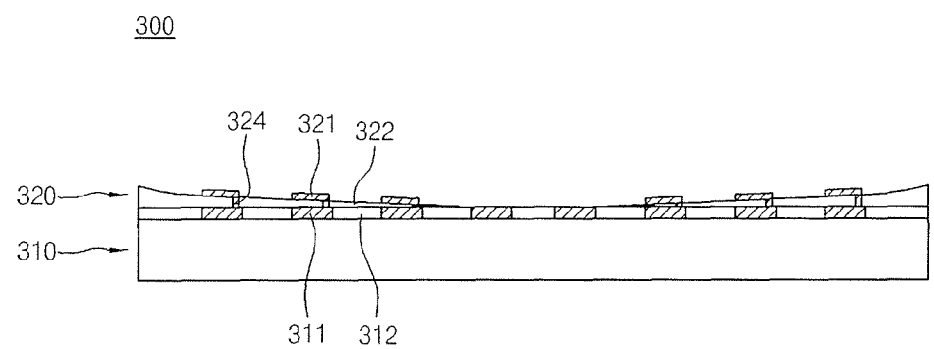

Referring to FIG. 6D, differently from the printed circuit board 300 having the fifth structure, a printed circuit board 300 having an eighth structure has a structure in which conductive layer patterns 321 and connection pads 311 are separated from each other with a solder resist 322 interposed therebetween. In the eight structure shown in FIG. 6D, the conductive layer patterns 321 and connection pads 311 are electrically connected to each other by conductive connection members 324 formed through the solder resist 322.

The printed circuit board 300 having the eighth structure includes a body part 310 and a warpage compensating part 320.

The body part 310 can, for example, have a plate-like shape. The body part 310 has a first surface and a second surface which faces away from one surface. The body part 310 includes, on the first surface thereof, a plurality of connection pads 311 and a protective layer 312 which is formed in such a way as to expose the connection pads 311.

The warpage compensating part 320 is formed over the first surface of the body part 310. The warpage compensating part 320 includes the plurality of conductive patterns 321, the solder resist 322, and the conductive connection members 324.

The solder resist 322 is formed to have a height that gradually decreases from the edges toward the center of the first surface of the body part 310.

The conductive layer patterns 321 are formed over the solder resist 322. The plurality of conductive layer patterns 321 can have the same thickness. The conductive layer patterns 321 can include, for example, at least any one of copper, nickel, gold and solder.

The conductive connection members 324 electrically connect the conductive layer patterns 321 to the connection pads 311 through the solder resist 322.

Figure 7:
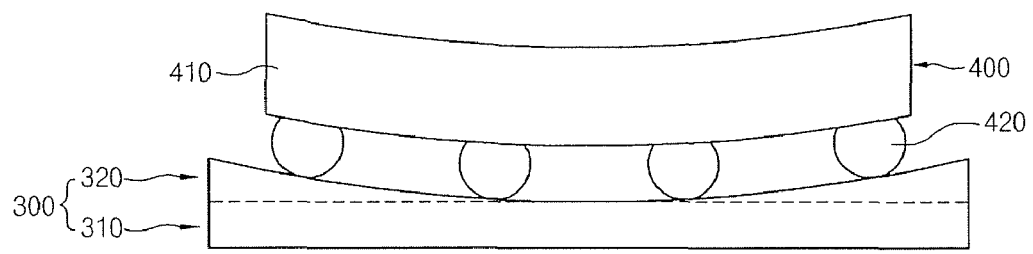
FIG. 7 is a cross-sectional view showing a semiconductor package using the printed circuit board in accordance with another embodiment of the present invention.

FIG. 7 is a cross-sectional view showing a semiconductor package using the printed circuit board in accordance with another embodiment of the present invention.

Referring to FIG. 7, a semiconductor package has a structure in which a semiconductor chip 400, which is warped so as to have a concave downward shape, is mounted to the printed circuit board 300 in accordance with another embodiment of the present invention, in a flip chip bonding type.

The printed circuit board 300 includes a body part 310 and a warpage compensating part 320 which is formed over the body part 310. The warpage compensating part 320 has a height that gradually decreases from the edges toward the center of the warpage compensating part 320 such that the upper surface of the warpage compensating part 320 is concave downward.

The semiconductor chip 400 is mounted to the upper surface of the warpage compensating part 320 of the printed circuit board 300 in the flip chip bonding type.

The semiconductor chip 400 includes a chip body 410 and a plurality of bumps 420. The chip body 410 can have, for example, a plate-like shape. While not shown in a drawing, bump pads are formed on the lower surface of the chip body 410. The bumps 420 are attached to the bump pads which are formed on the lower surface of the chip body 410.

The chip body 410 of the semiconductor chip 400 has a certain degree of warpage such that the chip body 410 is concave downward. Accordingly, even when warpage occurs in the semiconductor chip 400 in this way, the concave downward configuration of the warpage compensating part 320 of the printed circuit board 300 makes it possible to substantially prevent poor junctions from being formed or adjoining signal lines from being short-circuited due to collapse of the bumps 420 of the semiconductor chip 400.

As is apparent from the above description, in embodiments of the present invention, since a printed circuit board to contact a semiconductor chip has a profile corresponding to the curved surface of the warped semiconductor chip, the mounting reliability of the warped semiconductor chip can be improved.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A printed circuit board comprising:
   a body part formed with connection pads on a first surface thereof; and
   a warpage compensating part formed over the first surface of the body part and having a height that increases from edges toward a center of the warpage compensating part such that an upper surface of the warpage compensating part facing away from the first surface of the body part is convex upward,
   the warpage compensating part comprising:
   conductive layer patterns formed over the first surface of the body part so as to be electrically connected to the connection pads; and
   a solder resist formed over the first surface of the body part to expose the conductive layer patterns.

2. The printed circuit board according to claim 1, wherein the conductive layer patterns are formed on the connection pads.

3. The printed circuit board according to claim 1, wherein heights of the respective conductive layer patterns increase from both edges toward a center of the body part and the solder resist has a height that increases from both edges toward a center of the solder resist.

4. The printed circuit board according to claim 1, wherein the conductive layer patterns include at least any one of copper, nickel, gold and solder.

5. The printed circuit board according to claim 1, wherein the conductive layer patterns comprise conductive balls.

6. The printed circuit board according to claim 1, wherein the warpage compensating part further comprises insulation layer patterns which are formed under the conductive layer patterns and are covered by the conductive layer patterns.

7. The printed circuit board according to claim 6, wherein heights of the respective insulation layer patterns are proportional to heights of the conductive layer patterns which cover the insulation layer patterns.

8. The printed circuit board according to claim 7, wherein the insulation layer patterns have a hemispherical shape.

9. The printed circuit board according to claim 1, wherein the conductive layer patterns are formed over the solder resist and are separated from the connection pads such that the solder resist is interposed therebetween, and the warpage compensating part further comprises conductive connection members which electrically connect the conductive layer patterns to the connection pads by passing through the solder resist.

10. A printed circuit board comprising:
    a body part formed with connection pads on a first surface thereof; and
    a warpage compensating part formed over the first surface of the body part and having a height that decreases from edges toward a center of the warpage compensating part such that an upper surface of the warpage compensating part facing away from the first surface of the body part is concave downward, the warpage compensating part comprising:
- conductive layer patterns formed over the first surface of the body part to be electrically connected to the connection pads; and
- a solder resist formed over the first surface of the body part to expose the conductive layer patterns, wherein the solder resist has a height that decreases from both edges toward a center of the solder resist.

11. The printed circuit board according to claim 10, wherein the conductive layer patterns are formed on the connection pads.

12. The printed circuit board according to claim 10, wherein heights of the respective conductive layer patterns decrease from both edges toward a center of the body part.

13. The printed circuit board according to claim 10, wherein the conductive layer patterns include at least any one of copper, nickel, gold and solder.

14. The printed circuit board according to claim 10, wherein the conductive layer patterns comprise conductive balls.

15. The printed circuit board according to claim 10, wherein the warpage compensating part further comprises insulation layer patterns which are formed under the conductive layer patterns and are covered by the conductive layer patterns.

16. The printed circuit board according to claim 15, wherein heights of the respective insulation layer patterns are proportional to heights of the conductive layer patterns which cover the insulation layer patterns.

17. The printed circuit board according to claim 15, wherein the insulation layer patterns have a hemispherical shape.

18. The printed circuit board according to claim 10, wherein the conductive layer patterns are formed over the solder resist and are separated from the connection pads such that the solder resist is interposed therebetween, and the warpage compensating part further comprises conductive connection members which electrically connect the conductive layer patterns to the connection pads by passing through the solder resist.

19. A semiconductor device comprising:
- a printed circuit board comprising a body part and a warpage compensation part formed over a first surface of the body part, the warpage compensation part having a height that increases or decreases from edges toward a center of the warpage compensating part:
- a semiconductor chip electrically connected to the printed circuit board and having a semiconductor chip body, the semiconductor chip body having a warped shape such that a surface thereof facing the warpage compensating part is curved in a manner corresponding to the increasing or decreasing height of the warpage compensating part.

20. The semiconductor device according to claim 19, wherein the body part is formed with connection pads on the first surface thereof, and the warpage compensating part comprises:
- conductive layer patterns formed over the first surface of the body part so as to be electrically connected to the connection pads; and
- a solder resist formed over the first surface of the body part so as to expose the conductive layer patterns, the solder resist having a height that gradually increases from both edges toward a center of the solder resist, and
- wherein the semiconductor chip comprises bumps formed on the surface of the semiconductor chip body facing the warpage compensating part so as to be electrically connected to the conductive layer patterns.

* * * * *